United States Patent [19]

Sinton

[11] Patent Number: 5,164,019
[45] Date of Patent: Nov. 17, 1992

[54] MONOLITHIC SERIES-CONNECTED SOLAR CELLS HAVING IMPROVED CELL ISOLATION AND METHOD OF MAKING SAME

[75] Inventor: Ronald A. Sinton, Palo Alto, Calif.
[73] Assignee: SunPower Corporation, Sunnyvale, Calif.
[21] Appl. No.: 738,696
[22] Filed: Jul. 31, 1991
[51] Int. Cl.⁵ .................. H01L 31/042; H01L 31/18
[52] U.S. Cl. ........................ 136/249; 437/2; 437/51; 437/61; 437/68; 437/205
[58] Field of Search .............. 136/249 MS file, 244; 437/2, 4-5, 51, 61, 68, 205

[56] References Cited

U.S. PATENT DOCUMENTS

| | | | |
|---|---|---|---|
| 2,305,576 | 12/1942 | Lamb | 136/249 |
| 4,128,732 | 12/1978 | Kaplow et al. | 136/246 |
| 4,193,081 | 3/1980 | Kaplow et al. | 136/246 |
| 4,234,352 | 11/1980 | Swanson | 136/253 |
| 4,330,680 | 5/1982 | Goetzberger | 136/247 |
| 4,525,594 | 6/1985 | Pschunder | 136/256 |
| 4,612,408 | 9/1986 | Moddel | 136/244 |
| 4,753,683 | 6/1988 | Ellion et al. | 136/244 |
| 4,789,641 | 12/1988 | Inuzuka | 437/4 |
| 4,927,770 | 5/1990 | Swanson | 437/2 |
| 4,933,021 | 6/1990 | Swanson | 136/249 |
| 4,933,022 | 6/1990 | Swanson | 136/249 |
| 5,045,481 | 9/1991 | Schilling et al. | 437/2 |
| 5,100,808 | 3/1992 | Glenn | 437/2 |

FOREIGN PATENT DOCUMENTS

| | | | |
|---|---|---|---|
| 52-19987 | 2/1977 | Japan | 136/249 MS file |
| 53-79479 | 7/1978 | Japan | 136/249 MS file |

*Primary Examiner*—Aaron Weisstuch
*Attorney, Agent, or Firm*—Townsend and Townsend

[57] ABSTRACT

Series connected cells of a solar array formed in a monolithic semiconductor substrate are electrically isolated by forming grooves in a first major surface partially through the substrate between cells and then fracturing the substrate from the bottom of the grooves to an opposing major surface. Metallization interconnecting the cells provides physical integrity of the cell array after the fracturing of the substrate. The grooves can be formed prior to completion of fabrication of the cells or after fabrication of the cells. In an array embodiment where each cell extends from one major surface to the opposing major surface, the grooves can be formed in both major surfaces.

11 Claims, 2 Drawing Sheets

MONOLITHIC SERIES-CONNECTED SOLAR CELLS HAVING IMPROVED CELL ISOLATION AND METHOD OF MAKING SAME

BACKGROUND OF THE INVENTION

This invention relates generally to monolithic series connected solar cells, and more particularly the invention relates to electrically isolating adjacent cells in such a structure.

The semiconductor solar cell comprises a plurality of p and n conductivity-type regions in a semiconductor body which generate a voltage potential and/or a current when electron-hole pairs are created in the semiconductor body in response to impinging radiation and the holes and electrons migrate to the p-doped region and n-doped region, respectively.

Silicon solar cells generally operate at high currents and low voltages. For example, a solar cell fabricated on a standard 4 inch round wafer will produce about 3 amperes of current at a voltage of about 0.6 volt. These high currents (e.g. 3 amperes for only 1.8 watts of power) make it difficult to interconnect cells into any module without voltage drops comparable to the 0.6 volt output voltage, thus resulting in very significant power losses. For solar cells designed to work under concentrated light, the problem is much more severe. For example, at 300× concentration, the current from such a wafer would be about 900 amperes, yet the voltage would be only 0.7 volt. For applications requiring large, high power solar cells many cells on the same wafer are series connected so that the output voltage from the wafer can be multiplied. Accordingly, in monolithic structures where the cells share a common substrate, electrical isolation of the cells must be provided.

Heretofore a number of monolithic solar cell configurations have been provided for serially connecting the individual cells. Borden U.S. Pat. No. 4,278,431 proposes a mesa structure for each cell with the mesa physically separating epitaxial layer regions which comprise the active portions of each cell. The cells are then serially connected by metal plating formed over oxide isolation in the grooved regions between mesas. Goetzberger U.S. Pat. No. 4,330,680 uses physical shaping to increase electrical resistance of a semiconductor substrate between cells and thereby provide enhanced electrical isolation. P and n regions for each cell are formed on opposing sides of the substrate, and the grooves are chemically etched from alternate sides of the substrate to increase resistance of the substrate between cells. Swanson U.S. Pat. No. 4,933,021 discloses an interdigitated solar cell having p and n regions formed in alternating rows in one surface of a substrate with metal contacts provided and contacting all of the doped regions in one row with all rows of like doped regions being connected in parallel. Electrical isolation between cells in the interdigitated solar cell is enhanced by the use of shorted p-n junctions between cells with metallization for serially connecting the cells, shorting the p-n junctions, and thereby absorbing minority carriers flowing between the adjacent cells.

Kaplow et al. U.S. Pat. No. 4,128,732 and U.S. Pat. No. 4,193,081 disclose solar cells which are individually isolated in a substrate by etching completely through the substrate and with the removed portions in the substrate also providing cooling passages between adjacent side walls of adjoining unit cells through which a heat transfer medium is transmitted.

SUMMARY OF THE INVENTION

An object of the present invention is an improved isolation of serially connected cells in a monolithic semiconductor solar cell structure.

Another object of the invention is a method of fabricating a monolithic series connected solar cell array with enhanced electrical isolation between cells.

A feature of the invention is the fracture of a semiconductor substrate between cells therein to effect electrical isolation of the cells in the substrate.

Briefly, any of a number of monolithic series connected solar cell structures can be fabricated with enhanced electrical isolation in accordance with the invention. During or after the standard fabrication process portions of the substrate between cells are removed such as by chemical etching, scribing, sawing and the like, with the removed portions forming grooves extending only partially through the substrate so that the substrate retains physical integrity. After metallization is provided for electrically interconnecting the cells, the substrate is fractured where the semiconductor portions have been removed. This is readily accomplished by flexing the wafer, for example. The metallization electrically interconnecting the individual cells provides the necessary physical integrity for the array of cells. The exposed semiconductor material along the fracture naturally oxidizes, thereby enhancing the electrical isolation due to the interruption of the crystalline structure at the fracture points. If the grooves are formed during the processing of the substrate and prior to an oxidation step, the grooves are further oxidized and provide passivated isolation between cells.

The invention and objects and features thereof will be more readily apparent from the following detailed description and appended claims when taken with the drawings.

BRIEF DESCRIPTION OF THE DRAWING

FIGURE IA is a perspective view of a series connected solar cell array in accordance with one embodiment of the invention.

DETAILED DESCRIPTION OF ILLUSTRATIVE EMBODIMENTS

Figure 1A:
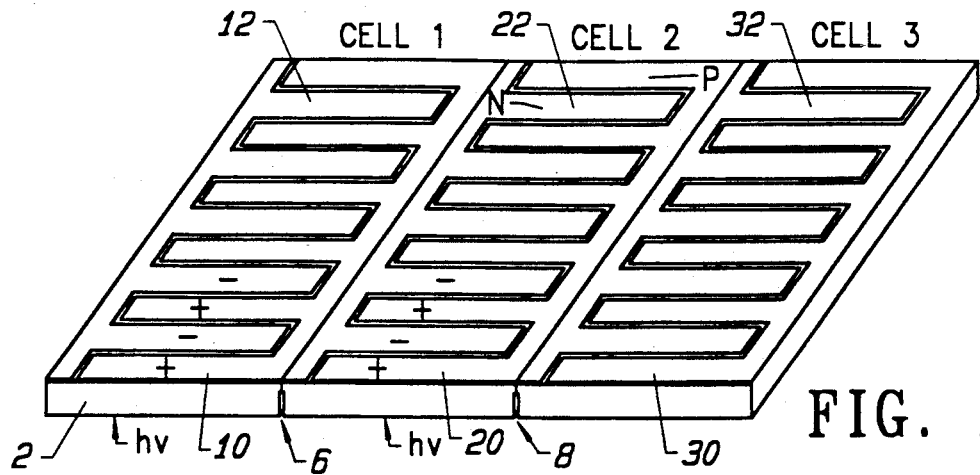
FIG. 1B is an enlarged portion of the solar cell array of FIG. 1A illustrating the electrical isolation of adjacent cells.

Referring now to the drawings, FIG. 1A is a perspective view of a portion of a solar cell array in which each cell comprises a plurality of p and n doped regions in one surface of a silicon substrate with interdigitated metallization selectively interconnecting all regions of like conductivity. In this embodiment, three adjacent cells are illustrated, although it will be appreciated that any number of cells can be serially connected. Such a cell array is illustrated, for example, in Swanson U.S. Pat. No. 4,933,021, supra. In cell 1 all p-doped regions are interconnected by a metallization 10, and all n-type doped regions are interconnected by a metallization 12. Similarly, in cell 2 the p-doped regions are interconnected by a metallization 20, and the n-doped regions are interconnected by metallization 22, and in cell 3 p-doped regions are interconnected by metallization 30 and the n-doped regions are interconnected by metallization 32. In serially connecting the cells, the metallization 10 for the p-doped regions in cell 1 is integral with the metallization 22 for the n- regions in cell 2; similarly the metallization 20 for the p regions of cell 2 is integral with the metallization 32 for the n-doped regions of cell 3. As described above, photons impinging on the opposite surface of the semiconductor substrate create electron-hole pairs in the semiconductor region which migrate to the p and n doped regions of each cell, thus creating a voltage/current in the cell.

In fabricating the cell array of FIG. 1A, a semiconductor wafer with backside contact solar cells is fabricated with thin film metallization connecting adjacent cells in series. This processing employs standard techniques as disclosed for example in Swanson U.S. Pat. No. 4,234,352. In addition to the use of sputtered aluminum metal interconnection, other metal such as copper, gold, and silver can be employed and other deposition techniques such as vapor evaporation, screen printing, and electrical plating can be employed.

Figure 1B:
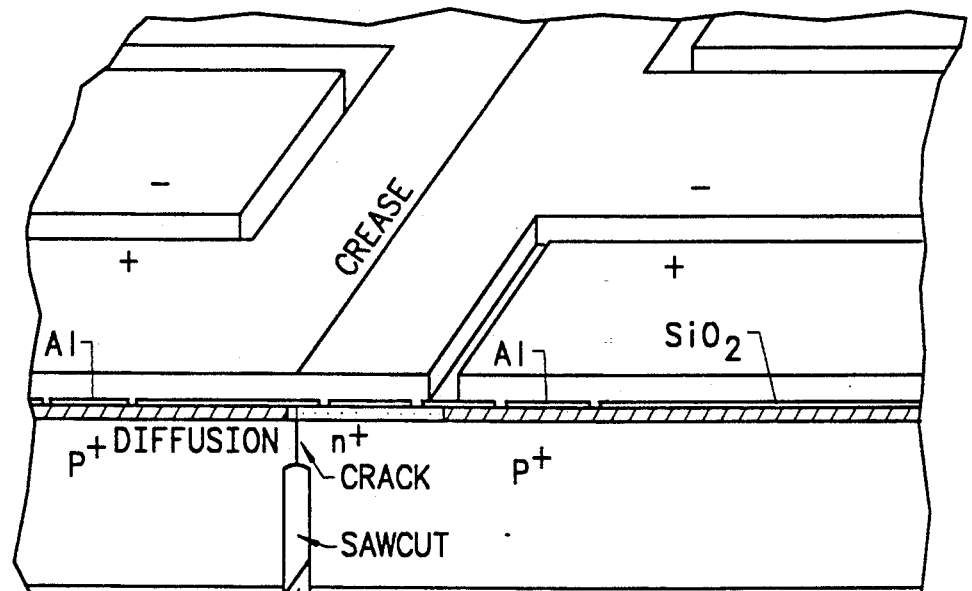

In accordance with the invention, portions of the substrate 2 between the cells are partially removed to form grooves as illustrated at 6 and 8 by chemical etching, sawing, or scribing the front surface of the wafer. The grooves can be formed during processing, in which case the wafer retains sufficient physical integrity for subsequent processing of the semiconductor substrate, including selectively doping the regions of each cell, oxidation, providing anti-reflective coatings, and forming the metallization patterns for selectively interconnecting the doped regions of the cells. The oxidized grooves provide passivated isolation between cells. Upon completion of the fabrication of the cell array, the semiconductor substrate is fractured along the grooved portions in the wafer as illustrated in more detail in FIG. 1B. The fracture disrupts the crystalline structure from the bottom of the groove 6, for example, to the metallization on the surface of the substrate which interconnects the adjacent cells. Thus the groove and the crack resulting from the fracture of the substrate electrically isolate the semiconductor material in adjacent cells. Advantageously, in silicon solar cells the silicon material forms native silicon oxides that naturally grow on bare silicon thus enhancing the electrical isolation of the cells.

By forming the grooves early in the process by sawing or by an anisotropic etch, for example, the grooves will be oxidized during the thermal oxidation of the light receiving surface. The oxide passivated grooves will then have the same quality of surface as the rest of the front side of the solar cell. The grooves can extend nearly all the way through the wafer, and in the case were the grooves extend to within 50 microns from the opposing surface the detrimental effects of the cracks as recombination centers will be reduced to an effective area of less than 100 microns. This will result in an efficiency loss of only 1% for a cell with a one centimeter cell length. This effectively passivates the cell separation, thus allowing for smaller cells (more in series per wafer).

Alternatively, the grooves can be formed in the surface of the substrate by scribing, etching or saw cuts following the processing and metallization such as by aluminum sputtering. This method is easier to implement. At a stage just prior to attaching the wafer to a heat sink or cover glass with adhesive or solder, the wafer is flexed in order to crack the silicon that has remained in the bottom of each saw cut. The aluminum metallization is left continuous and provides both electrical interconnection and physical integrity for the cell array. The cracks isolate adjacent cells, typically with a resistance greater than 1,000 ohms. The net result is that all of the wafers are interconnected effectively by the foil into a high voltage array. The method of fabrication allows interconnection to be done in batch with extreme precision (e.g. 5 micron alignment precision between cells).

A major advantage of the isolation technique is that standard integrated circuit manufacturing techniques are employed up to the last step, cracking of the cells, a step which is trivial to perform. Each wafer is then a pre-wired module with the pre-wired monolithically series connected wafer avoiding the cost, yield, and reliability issues associated with all of the standard steps of handling individual solar cells.

Figure 2:
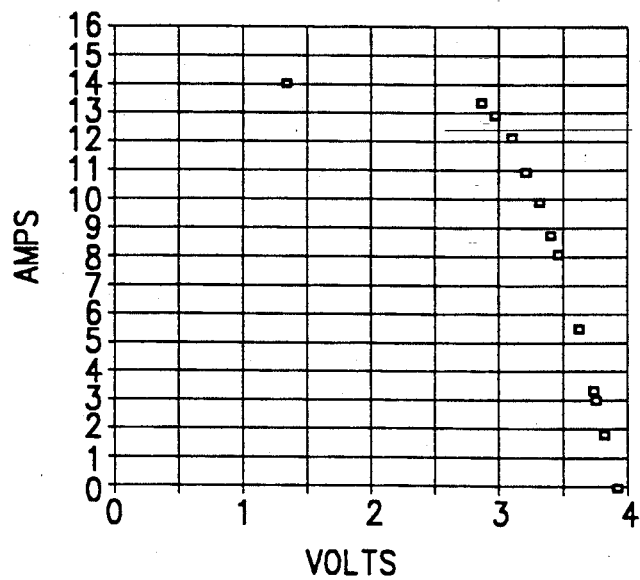
FIG. 2 is a plot illustrating the current-voltage curve for a plurality of monolithic series connected solar cells in accordance with FIG. 1.

FIG. 2 is an I-V curve of a cell array fabricated as illustrated in FIG. 1 with the cell array including 5 cells each 1.2 centimeters long by 3 centimeters wide and with the cells series connected as described. The cell array was tested under concentrated light, and it will be noted that the open circuit voltage from the cells is about 4 volts. This indicates that the cells are functioning in series. The available current is 14 amperes. The shape of the I-V curve indicates that there are no significant current paths connecting the cells. If the cell array were a single cell of the same area instead of 5 cells in series, the open circuit voltage at the same light intensity would only be 0.8 volt and the current would be 70 amperes.

Figure 3A:
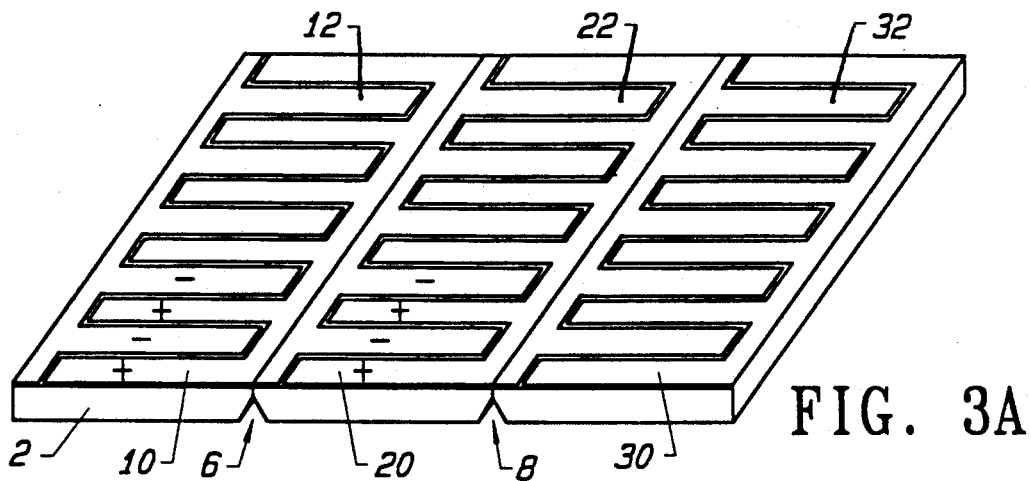
FIG. 3A is a perspective view of a solar cell array in accordance with another embodiment of the invention.
Figure 3B:
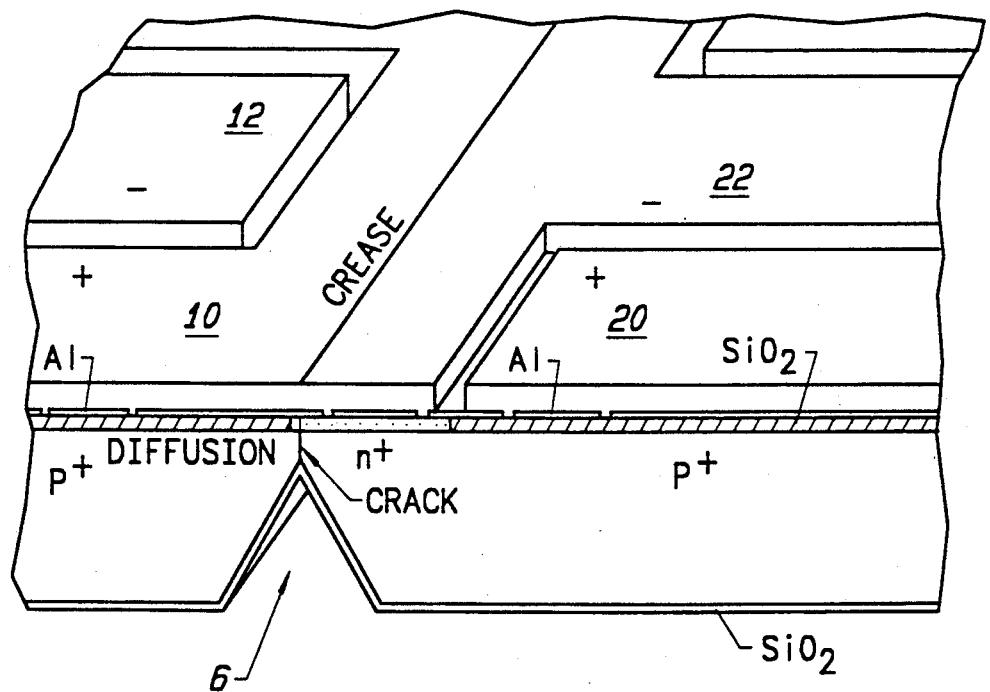
FIG. 3B is an enlarged portion of the array of FIG. 3A illustrating the electrical isolation of adjacent cells.

FIG. 3A and 3B are perspective views of a cell array in accordance with another embodiment of the invention. The array is similar in structure to the array of FIG. 1A and FIG. 1B, and like elements have the same reference numerals. However, in this embodiment the grooves are formed by an anisotropic etch. So long as the grooves are formed prior to the final oxidation, the grooves will be oxidized. Because of this, the grooves will have the same quality of surface at the rest of the front side of the solar cell. The thermally grown oxide provides a surface with the best performance known for solar cells, and is much superior to damaged, bare silicon of a saw cut. The cells are then cracked at the weak lines formed by the grooves. The grooves can extend nearly all the way through the wafer, and when the grooves extend to within 50 microns from penetrating the wafer the detrimental effects of the cracks as recombination centers is reduced to an effective dead area of less than 100 microns. This results in an efficiency loss of only 1% for a cell with one centimeter cell length. This effectively passivated cell separation allows for smaller cells (more in series per wafer) than in cells which are electrically isolated after fabrication using the saw cut method for the same efficiency loss due to the effect of carrier recombination at the boundary between cells. The grooves can be on either side of the wafer so long as they are formed prior to metallization. If they are on the side opposite the diffusions and metallization, as illustrated, they have no effect on the standard wafer processing.

Figure 4:
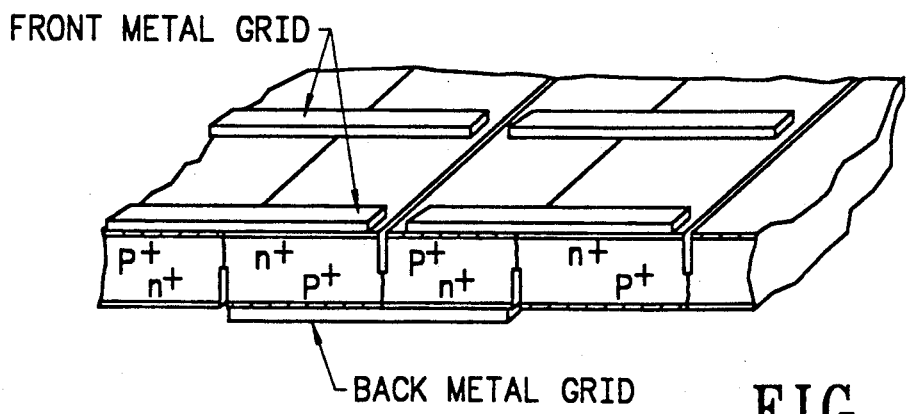
FIG. 4 is a perspective view of a solar cell array in accordance with another embodiment of the invention.

FIG. 4 is a perspective view of a solar cell array in accordance with another embodiment of the invention. The cell array is similar to that shown in Goetzberger U.S. Pat. No. 4,330,680, supra. In this embodiment each cell includes a p-doped region and an n-doped region on opposite sides of the wafer with adjacent cells interconnected by metallization on alternating sides of the wafer. The groove/crack isolation occurs from both sides of the semiconductor substrate. The front grid and the back metallization alternately act to series connect the cell and hold the semiconductor pieces together.

The use of groove/crack isolation in a solar cell array greatly enhances the electrical isolation of adjacent cells and is compatible with conventional semiconductor processing in fabricating the solar cell arrays. While the invention has been described with reference to a specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of electrically isolating series connected cells in a solar cell array formed in a semiconductor substrate, comprising the steps of
   a) forming grooves in at least one surface of said substrate partially through said substrate between adjacent cells, and then
   b) fracturing said semiconductor substrate from the bottom of said grooves to another surface of said substrate thereby disrupting said substrate between cells.

2. The method as defined by claim 1 wherein step a) is performed prior to completion of the fabrication of said cells, and step b) is performed after fabrication of said cells.

3. The method as defined by claim 1 wherein step a) and step b) are performed after fabrication of said cells.

4. The method as defined by claim 1 wherein step a) includes sawing said substrate.

5. The method as defined by claim 1 wherein step a) includes etching said substrate.

6. The method as defined by claim 1 wherein step a) includes scribing said substrate.

7. The method as defined by claim 1 wherein step a) includes forming grooves in opposing surfaces of said substrate partially through said substrate.

8. A solar cell array including a plurality of serially connected cells comprising:
   a semiconductor substrate having two major opposing surfaces,
   a plurality of cells formed in said substrate,
   metallization serially interconnecting said cells,
   a first plurality of grooves extending partially through said substrate from one major surface, and
   fractures of said substrate extending from said grooves to the other major surface, said grooves and said fractures providing electrical isolation between adjacent cells with said metallization physically and electrically connecting said cells.

9. The solar cell array as defined by claim 8 wherein said cells are formed in the other major surface.

10. The solar cell array as defined by claim 9 wherein said grooves are formed by a process selected from the group consisting of sawing, etching, and scribing, and said fractures are formed by flexing said substrate.

11. The solar cell array as defined by claim 8 wherein each cell extends from one major surface to the other major surface,
    said metallization alternately connects adjacent cells on said two major surfaces,
    a second plurality of grooves extends partially through said substrate from the other major surface, and
    fractures of said substrate extend from said second plurality of grooves to said one major surface.

* * * * *